US00RE47093E

(19) United States
(12) Reissued Patent
Tokue et al.

(10) Patent Number: US RE47,093 E
(45) Date of Reissued Patent: Oct. 23, 2018

(54) IMPRINT PATTERN FORMING METHOD

(71) Applicant: Toshiba Memory Corporation, Tokyo (JP)

(72) Inventors: Hiroshi Tokue, Yokohama (JP); Ikuo Yoneda, Yokohama (JP); Ryoichi Inanami, Yokohama (JP)

(73) Assignee: Toshiba Memory Corporation, Tokyo (JP)

(21) Appl. No.: 15/292,073

(22) Filed: Oct. 12, 2016

Related U.S. Patent Documents

Reissue of:
(64) Patent No.: 8,444,889
Issued: May 21, 2013
Appl. No.: 12/726,503
Filed: Mar. 18, 2010

U.S. Applications:
(63) Continuation of application No. 14/717,980, filed on May 20, 2015, now Pat. No. Re. 46,191, which is an application for the reissue of Pat. No. 8,444,889.

(30) Foreign Application Priority Data

Mar. 25, 2009 (JP) ..... 2009-073897

(51) Int. Cl.
*B29C 59/02* (2006.01)
*G01B 11/10* (2006.01)
*B29C 43/02* (2006.01)
*B82Y 10/00* (2011.01)

(52) U.S. Cl.
CPC ..... *B29C 43/021* (2013.01); *B82Y 10/00* (2013.01)

(58) Field of Classification Search
None
See application file for complete search history.

(56) References Cited

U.S. PATENT DOCUMENTS

2006/0172549 A1* 8/2006 Choi et al. ..... 438/758
2007/0114686 A1* 5/2007 Choi et al. ..... 264/2.7
2007/0278712 A1* 12/2007 Okushima et al. ..... 264/236
2009/0108484 A1* 4/2009 Kruijt-Stegeman ... B82Y 10/00 264/40.5

(Continued)

FOREIGN PATENT DOCUMENTS

JP 2000-194142 7/2000
JP 2000-194142 A 7/2000

(Continued)

OTHER PUBLICATIONS

Guo, L. Jay; "Recent Progress in nanoimprint technology and its applications," J. Phys. D: Appl. Phys. 37 (2004).

(Continued)

*Primary Examiner* — Terrence Till
(74) *Attorney, Agent, or Firm* — Finnegan, Henderson, Farabow, Garrett & Dunner, L.L.P.

(57) ABSTRACT

An imprint pattern forming method includes contacting a template with a pattern in a front surface with an imprint material formed in a substrate to fill the imprint material into the pattern, curing the imprint material filled in the pattern to form an imprint material pattern, and after forming the imprint material pattern, separating the template from the imprint material pattern while applying pressure to the back surface of the template.

40 Claims, 7 Drawing Sheets

(56) References Cited

U.S. PATENT DOCUMENTS

| | | | | |
|---|---|---|---|---|
| 2009/0140445 | A1 | 6/2009 | Lu et al. | |
| 2009/0174115 | A1* | 7/2009 | Loopstra et al. | 264/293 |
| 2010/0102469 | A1* | 4/2010 | Khusnatdinov | B82Y 10/00 264/40.1 |

FOREIGN PATENT DOCUMENTS

| | | | |
|---|---|---|---|
| JP | 2001-68411 | | 3/2001 |
| JP | 2001-068411 | A | 3/2001 |
| JP | 2007-329367 | | 12/2007 |
| JP | 2007-329367 | A | 12/2007 |
| KR | 10-2010-0068830 | | 6/2010 |
| KR | 2010-0068830 | A | 6/2010 |

OTHER PUBLICATIONS

Notification for Filing Opinion mailed Oct. 20, 2011, issued by Korean Patent Office in KR 2010-20259.

"Recent Progress in nanoimprint technology and its applications", J. Phys. D: Appl. Phys. 37 (2004) R123-R141, L. Jay Guo.*

* cited by examiner

IMPRINT PATTERN FORMING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*Notice: More than one reissue application has been filed for the reissue of U.S. Pat. No. 8,444,889. The reissue applications are Reissue application Ser. No. 14/717,980 (issued as Reissue Pat. No. RE46,191 on Nov. 1, 2016), and the present application filed herewith.*

This application *is a continuation reissue application of U.S. patent application Ser. No. 14/717,980 (issued as Reissue Pat. No. RE46,191 on Nov. 1, 2016), filed May 20, 2015, which is a reissue application of U.S. Pat. No. 8,444,889, issued on May 21, 2013, from U.S. patent application Ser. No. 12/726,503, which* is based upon and claims the benefit of priority from prior Japanese Patent Application No. [2009-073897] *2009-0738897*, filed Mar. 25, 2009[, the]. *This application is also a reissue application of U.S. Pat. No. 8,444,889. The* entire contents of [which] *the above-identified applications* are incorporated herein by reference.

BACKGROUND OF THE INVENTION

1. Field of the Invention

The present invention relates to an imprint pattern forming method.

2. Description of the Related Art

In recent years, much effort has been made to develop a micromachining technique called nano imprinting.

In a pattern forming method using the nanoimprinting, first, a template in which a pattern to be transferred is formed is contacted with a photocurable organic material (resist) coated on a substrate. Then, the resist is irradiated with light and thus cured. The template is then separated from the resist to form a resist pattern (see, for example, Jpn. Pat. Appln. KOKAI Publication Nos. 2001-68411 and 2000-194142).

However, in the step of separating the template from the resist, part of the resist is disadvantageously likely to be pulled out by the template depending on a density distribution of the pattern, resulting in a defect. Thus, the pattern forming method does not always allow patterns to be properly formed.

BRIEF SUMMARY OF THE INVENTION

According to an aspect of the present invention, there is provided an imprint pattern forming method comprising: contacting a template with a pattern in a front surface with an imprint material formed in a substrate to fill the imprint material into the pattern; curing the imprint material filled in the pattern to form an imprint material pattern; and after forming the imprint material pattern, separating the template from the imprint material pattern while applying pressure to the back surface of the template.

DETAILED DESCRIPTION OF THE INVENTION

An embodiment of the present invention will be descried below with reference to the drawings.

(Embodiment)

FIGS. 1, 2, 3 and 4 are sectional views schematically showing a basic imprint method according to the present invention.

Figure 1:
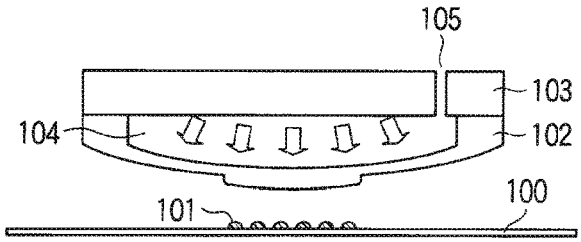
FIG. 1 is a sectional view schematically showing a part of an imprint method according to an embodiment of the present invention.

As shown in FIG. 1, an appropriate amount of photocurable organic material (resist) 101 as a pattern forming material (imprint material) is dropped onto a processing target surface of a substrate 100 according to an inkjet scheme. In FIG. 1, the resist 101 is scattered on the processing target surface of the substrate 100 at a plurality of points. However, the resist 101 may be formed into a pattern forming material layer in a given area. A template 102 includes a pattern formed in a front surface and is held on the front surface of a template holding section 103. Furthermore, the back surface of the template 102 and the front surface of the template holding section 103 form a space 104. The back surface side of the template holding section 103 connects to a moving mechanism (not shown in the drawings) configured to move the template 102 and the template holding section 103 via a load measuring section (not shown in the drawings). The load measuring section is, for example, a spring balance including a pressure sensor. The load measuring section is used to measure a load imposed on the template 102. Additionally, the template holding section 103 comprises an inlet 105 through which for example, gas is introduced into or discharged from the space 104. The template 102 is made of, for example, glass. The area in which the pattern is formed is substantially flat.

First, for example, gas is introduced into the space 104. Thus, pressure is applied to the back surface of the template 102 to bend the template 102 such that the template 102 protrudes toward the front surface.

Figure 2:
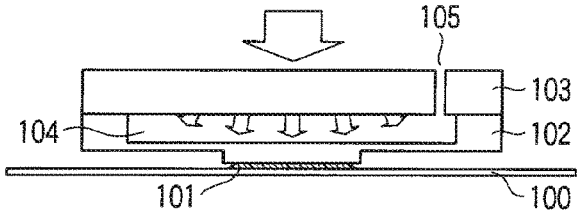
FIG. 2 is a sectional view schematically showing a part of the imprint method according to the embodiment of the present invention.

Then, as shown in FIG. 2, the template 102 and the substrate 100 are assigned with each other. With the gas held in the space 104, the plate 102 is lowered vertically to bring the template 102 into contact with the resist 101. The resist 101 is then filled into the pattern (recess pattern) in the template 102.

Figure 3:
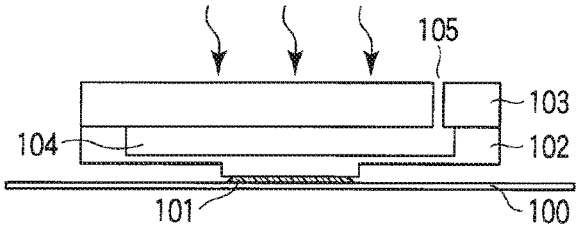
FIG. 3 is a sectional view schematically showing a part of the imprint method according to the embodiment of the present invention.

Then, as shown in FIG. 3, when the resist 101 is filled into the pattern in the template 102, the gas in the space 104 is discharged to reduce the pressure in the space 104. When a pattern formation area in the template 102 is substantially flattened, the resist 101 is irradiated with ultraviolet rays from above the template holding section 103 in order to be sufficiently cured. Thus, a resist pattern (imprint material pattern) is formed on the photocurable organic material 101.

Figure 4:
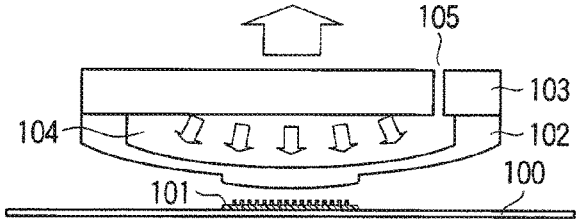
FIG. 4 is a sectional view schematically showing a part of the imprint method according to the embodiment of the present invention.

As shown in FIG. 4, gas is introduced into the space 104. As described below, the template 102 is lifted vertically and separated from the resist 101. Thus, the pattern shape formed in the template 102 is transferred to the resist 101.

A separation method shown in FIG. 4 will be described in detail with reference to FIGS. 5, 6, 7, 8, 9, 10, 11, 12, 13, 14A and 14B.

FIGS. 5, 6, 7 and 8 are sectional views showing a part of the separation method according to a comparative example of the present embodiment. FIGS. 9, 10, 11, 12 and 13 are sectional views showing a part of the separation method according to the present embodiment. FIG. 14A is a graph showing the relationship between a load and time in steps shown in FIGS. 5, 6, 7 and 8. FIG. 14B is a graph showing the relationship between a load and time in steps shown in FIGS. 9, 10, 11, 12 and 13.

Figure 5:
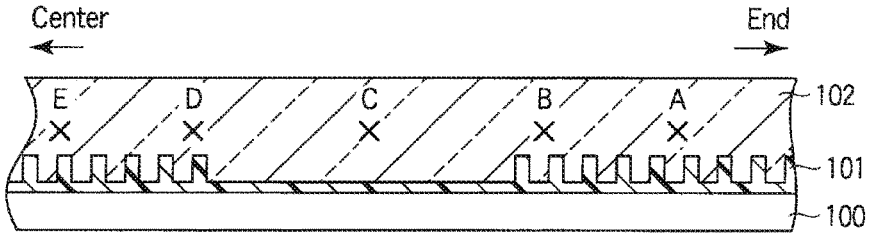
FIG. 5 is a sectional view schematically showing a part of an imprint method according to a comparative example of the embodiment of the present invention.

As shown in FIG. 5, the template 102 comprises an area A in which a dense pattern is formed, an area C in which a coarse pattern is formed, an area E in which a dense pattern is formed, an area B corresponding to the boundary between areas A and C, and an area D corresponding to the boundary between areas C and E. Furthermore, the template 102 and the resist 101 are in close contact with each other. The adhesion increases consistently with the size of the area in which the template 102 and the resist 101 are in contact with each other. That is, the adhesion increases consistently with the density of the pattern.

Figure 6:
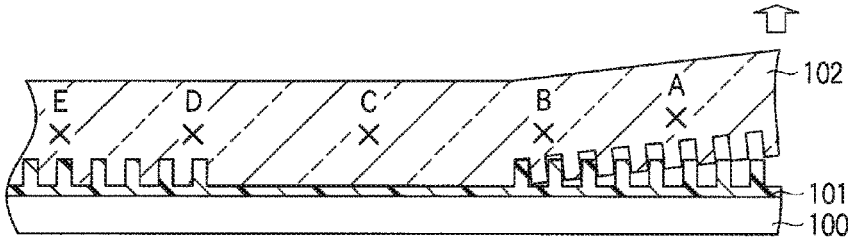
FIG. 6 is a sectional view schematically showing a part of the imprint method according to the comparative example of the embodiment of the present invention.

Then, when the template 102 is lifted vertically by a given force, the lifting generally starts from the periphery (end) of the template. Hence, the separation starts from the end and progresses from the end toward a central portion. Thus, as shown in FIG. 6, when lifted vertically by the given force, the separation progresses from area A, located at the end, toward area E, located in the central portion. In area A, the dense pattern is formed, and thus a heavy load is imposed on the template 102. Thus, the speed (hereinafter referred to as the separation speed) at which the template 102 is separated from the resist 101 is low. Here, the load imposed on the template 102 corresponds to the force with which the template is pulled by the resist. In other words, the load corresponds to the force required to separate the template from the resist.

Figure 7:
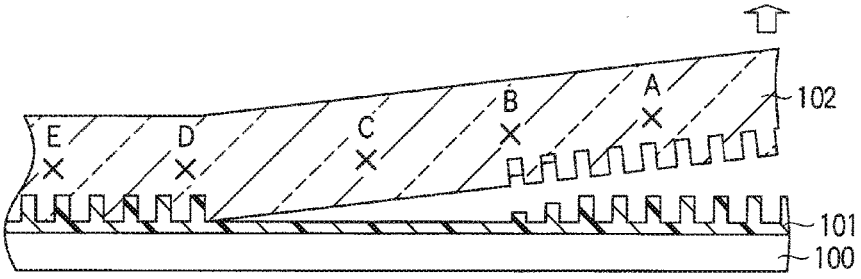
FIG. 7 is a sectional view schematically showing a part of the imprint method according to the comparative example of the embodiment of the present invention.

Then, as shown in FIGS. 7 and 14A, the adhesion decreases as the separating of template 102 from the resist 101 progresses to area A and area B, located near area C. Thus, the load imposed on the template 102 is rapidly reduced to rapidly increase the separation speed near area B. The separation speed refers to the speed at which the template is separated from the resist. As a result, a part of the resist 101 formed near area B is stripped by the template 102, resulting in a defect in the pattern.

Figure 8:
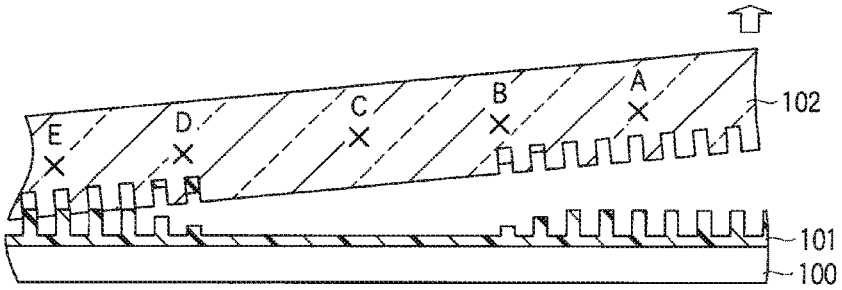
FIG. 8 is a sectional view schematically showing a part of the imprint method according to the comparative example of the embodiment of the present invention.

Furthermore, as shown in FIGS. 8 and 14A, in area C, the separation speed is high. Thus, area D is separated at the high separation speed. Consequently, a part of the resist 101 formed near area D is stripped by the template 102, resulting in a defect in the pattern. In area E, the dense pattern with the strong adhesion is formed. This serves to increase the load imposed on the template 102, while reducing the separation speed. Hence, a normal pattern is formed on a part of the resist 101 formed near area E.

As described above, in a part of the resist 101 formed near the boundary between the dense pattern and the coarse pattern, a rapid change in the load imposed on the template 102 may result in a defect in the pattern. In other words, a rapid change in the adhesion between the template 102 and the resist 101 may result in a defect in the pattern.

Now, a part of the separation method according to the present embodiment will be described.

Figure 9:
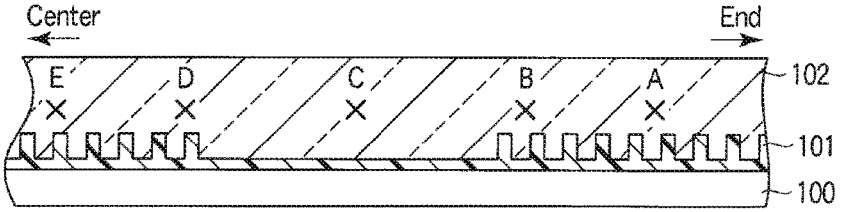
FIG. 9 is a sectional view schematically showing a part of the imprint method according to the embodiment of the present invention.

First, as shown in FIG. 9, the template 102 ad the resist 101 are in close contact with each other.

Figure 10:
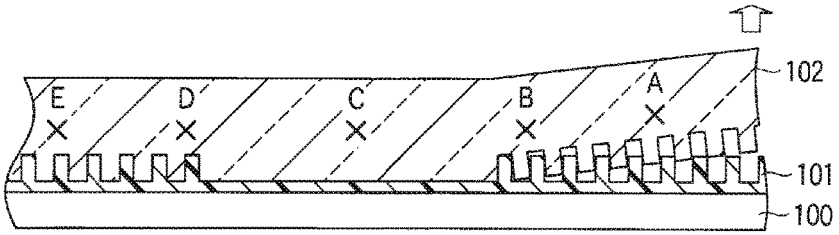
FIG. 10 is a sectional view schematically showing a part of the imprint method according to the embodiment of the present invention.

Then, as shown in FIG. 10, when lifted vertically by the given force, the template 102 is separated from the resist 101 starting from area A, located at the end. In area A, the dense pattern is formed. Thus, a heavy load is imposed on the template 102, and the separation speed is low. As a result, area A is separated normally.

Figure 11:
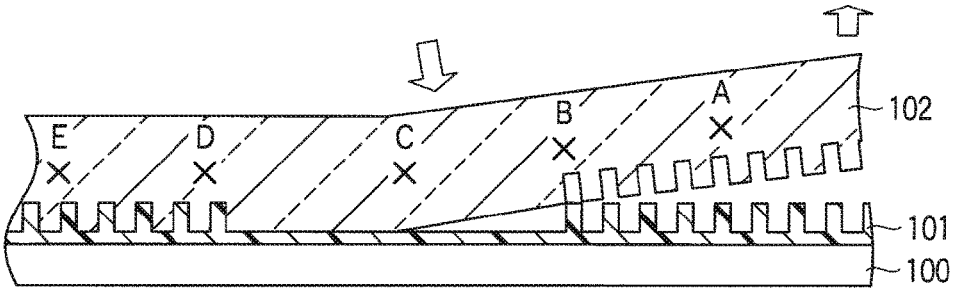
FIG. 11 is a sectional view schematically showing a part of the imprint method according to the embodiment of the present invention.

Then, as shown in FIG. 11, the adhesion decreases as the separating of the template 102 progresses to area A and area B, located near area C. Thus, the load imposed on the template 102 is rapidly reduced to rapidly increase the separation speed near area B. In this case, a lower load threshold and a higher load threshold are set in, for example, a control section (not shown in the drawings) connected to the load measuring section configured to measure the load imposed on the template 102. Then, when the load imposed on the template 102 reaches the lower load threshold, for example, gas is introduced into the space 104, that is, the back surface side of the template 102, to apply pressure to the back surface of the template 102. This increases the load imposed on the template 102, while reducing the separation speed. Thus, as shown in FIG. 14B, a rapid decrease in load during the separation of area B can be suppressed.

Figure 12:
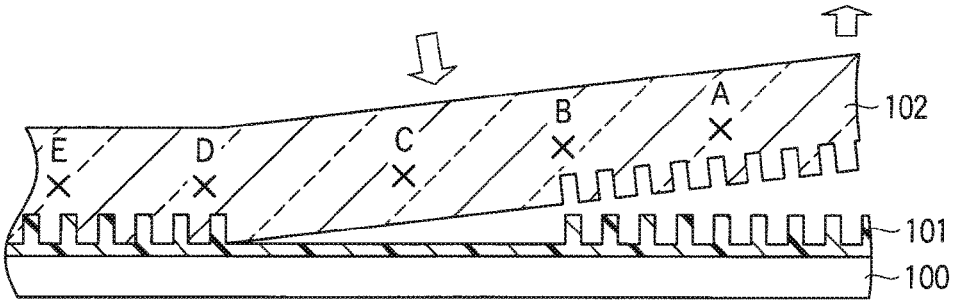
FIG. 12 is a sectional view schematically showing a part of the imprint method according to the embodiment of the present invention.

Then, as shown in FIG. 12, when area C, in which the coarse pattern is formed, is separated, the template 102 is separated from the resist 101 with pressure continuously applied to the back surface of the template 102 to keep the template 102 bent.

Figure 13:
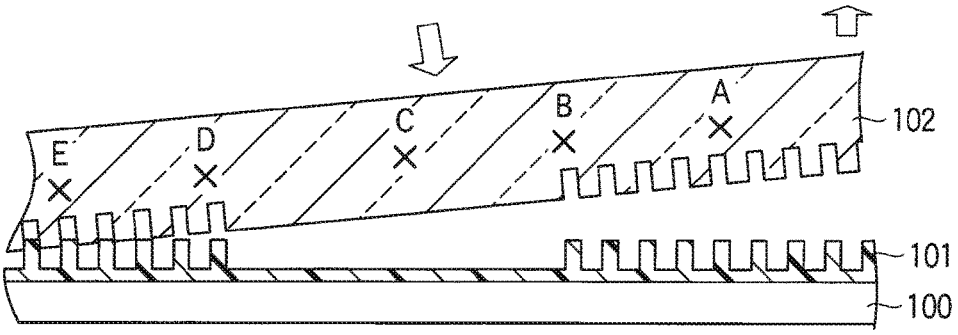
FIG. 13 is a sectional view schematically showing a part of the imprint method according to the embodiment of the present invention.
Figure 14A:
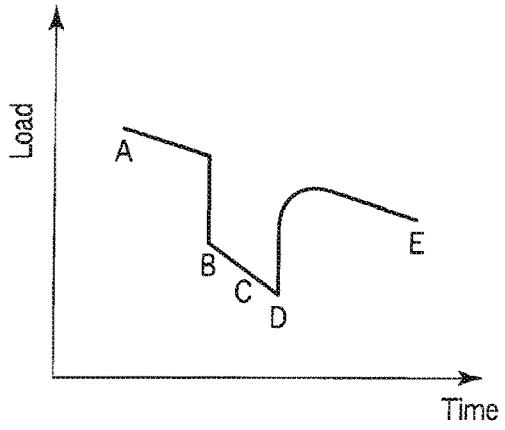
FIG. 14A is a diagram showing the relationship between a load and time in the steps shown in FIGS. 5 to 8.
Figure 14B:
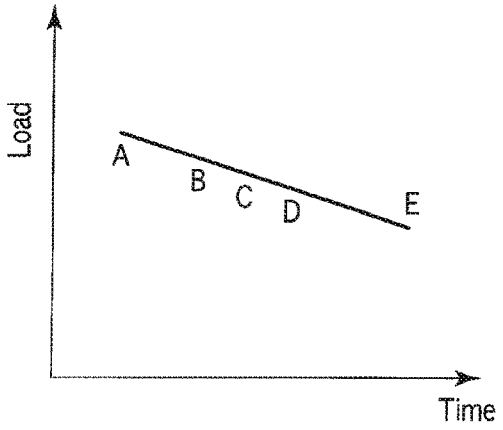
FIG. 14B is a diagram showing the relationship between a load and time in the steps shown in FIGS. 9 to 13.

Then, as shown in FIG. 13, when area D, where the coarse pattern shifts to the dense pattern, the template 102 is separated from the resist 101 with pressure applied to the back surface of the template 102 to keep the template 102 bent. Then, when area E, in which the dense pattern is formed, is separated, if the load imposed on the template 102 reaches the higher load threshold, the gas in the space 104 is discharged to reduce the pressure applied to the template 102.

That is, a possible defect in the pattern can be inhibited by performing control such that the load imposed on the template 102 or the change rate of the load is constant as shown in FIG. 14B. Thus, when the adhesion between the template 102 and the resist 101 varies rapidly, gas is introduced into the space 104 in order to keep the load imposed on the template 102 or the change rate of the load constant.

According to the above-described embodiment, the template holding section 103 comprises the load measuring section configured to measure the load imposed on the template 102 and the inlet 105 configured to introduce or discharge the gas into or from the space 104. When the template 102 is separating from the resist 101, the load imposed on the template 102 is measured using the load measuring section so that the gas can be introduced into or discharged from the back surface side of the template 102 through the inlet 105 depending on a change in load. Application of pressure to the back surface of the template allows the load imposed on the template 102 or the change rate of the load to be kept constant. This enables inhibition of a possible defect in the resist 101 caused by a rapid change in load.

(Modification 1)

In the above-described embodiment, the template holding section 103 comprises the load measuring section configured to measure the load imposed on the template 102. When the template 102 is separated, the load measuring section is used to measure the load imposed on the template 102 in order to allow determination of whether to introduce or discharge the gas into or from the space 104. In Modification 1, a method will be described which allows determination of whether to introduce or discharge the gas into or from the space 104 based on the separation speed of the template 102. The process through the step of filling the resist 101 into the pattern in the template 102 is similar to that in the above-described embodiment and thus will not be described.

The separation method shown in FIG. 4 will be described in detail with reference to FIGS. 15, 16, 17, 18, 19, 20A and 20B.

FIGS. 15, 16, 17, 18 and 19 are sectional views showing a part of the separation methods according to the present modification. Furthermore, FIG. 20A is a graph showing the relationship between the separation speed and time in the steps shown in FIGS. 5, 6, 7 and 8. FIG. 20B is a graph showing the relationship between the separation speed and time in the steps shown in FIGS. 15, 16, 17, 18 and 19.

As shown in FIG. 14A for the comparative example of the already-described embodiment, the load imposed on the template 102 decreases rapidly as the separation shifts from the dense pattern to the coarse pattern. Hence, as shown in FIG. 20A, the separation speed of the template 102 increases rapidly when the separation shifts from the dense pattern to the coarse pattern. Thus, in the present modification, the separation speed of the template 102 is controlled as described below.

Now, a part of the separation method according to the present modification will be described.

Figure 15:
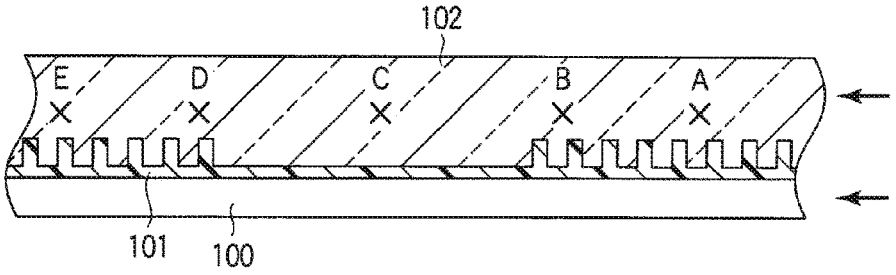
FIG. 15 is a sectional view schematically showing a part of an imprint method according to a modification 1 of the embodiment of the present invention.

First, as shown in FIG. 15, the template 102 and the resist 101 are in close contact with each other. In the present modification, as shown by arrows, for example, the ends of the template 102 and the substrate 100 are irradiated with laser beams to measure the speed at which the template 102 is separated from the substrate.

Figure 16:
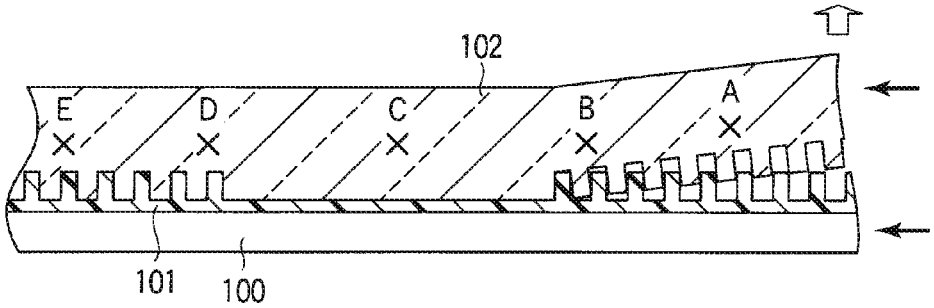
FIG. 16 is a sectional view schematically showing a part of the imprint method according to the modification 1 of the embodiment of the present invention.

Then, as shown in FIG. 16, when lifted by the given force, the template 102 is separated from the resist 101 starting from area A, which corresponds to the end. In area A, the dense pattern is formed. Thus, a heavy load is imposed on the template 102, and the separation speed of the template 102 is low. As a result, area A is separated normally.

Figure 17:
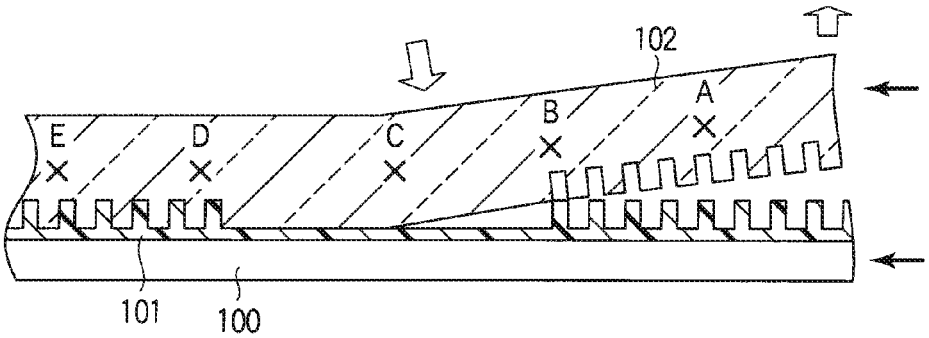
FIG. 17 is a sectional view schematically showing a part of the imprint method according to the modification 1 of the embodiment of the present invention.

Then, as shown in FIG. 17, the adhesion decreases as the separating of the template 102 progresses to area A and area B, located near area C. Thus, the load imposed on the template 102 is rapidly reduced to rapidly increase the separation speed near area B. In this case, a lower speed threshold and a higher speed threshold are set in, for example, a measuring section (not shown in the drawings) configured to measure the speed of the template 102. Then, when the speed of the template 102 reaches the higher speed threshold, for example, gas is introduced into the space 104, that is, the back surface side of the template 102, to apply pressure to the back surface of the template 102. This increases the separation speed of the template 102. Thus, as shown in FIG. 20B, a rapid increase in the separation speed of the template 102 during the separation of area B can be suppressed.

Figure 18:
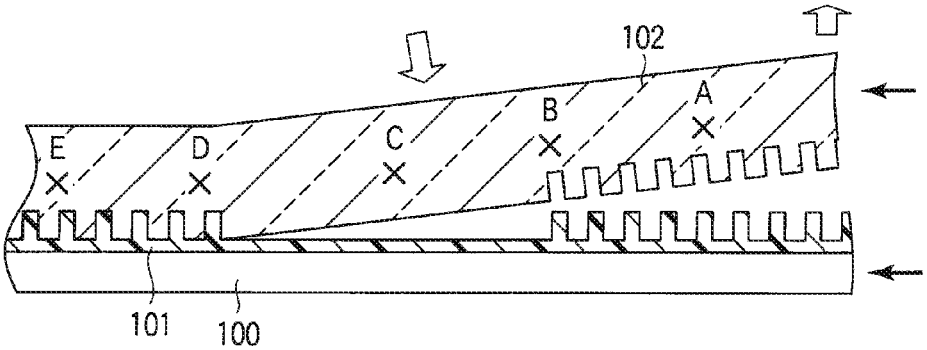
FIG. 18 is a sectional view schematically showing a part of the imprint method according to the modification 1 of the embodiment of the present invention.

Then, as shown in FIG. 18, when area C, in which the coarse pattern is formed, is separated, the template 102 is separated from the resist 101 with pressure continuously applied to the back surface of the template 102 to keep the template 102 bent.

Figure 19:
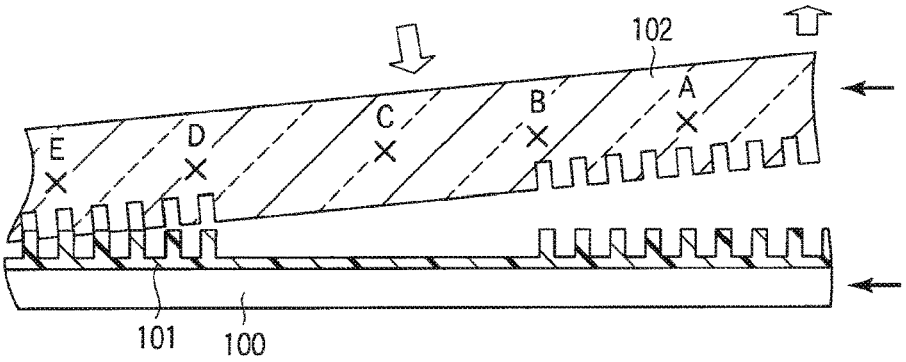
FIG. 19 is a sectional view schematically showing a part of the imprint method according to the modification 1 of the embodiment of the present invention.
Figure 20A:
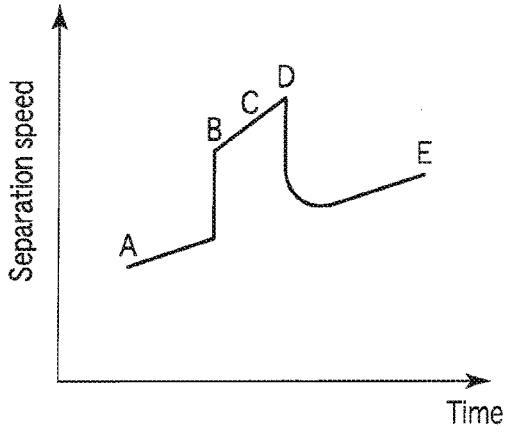
FIG. 20A is a diagram showing the relationship between a separation speed and time in the steps shown in FIGS. 5 to 8.
Figure 20B:
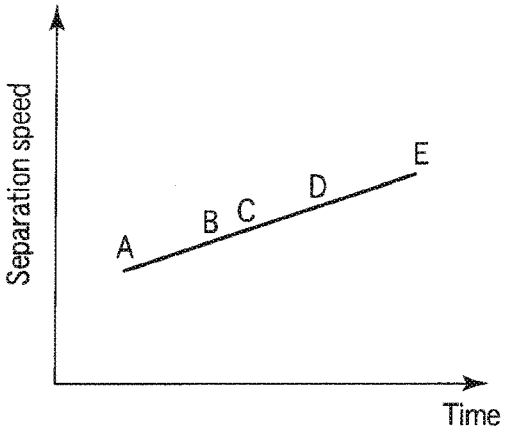
FIG. 20B is a diagram showing the relationship between a separation speed and time in the steps shown in FIGS. 15 to 19.

Then, as shown in FIG. 19, even when area D, where the coarse pattern changes to the dense pattern, is separated, pressure is continuously applied to the back surface of the template 102 to keep the template 102 bent. Then, if in area E, in which the dense pattern is formed, the separation speed reaches the lower speed threshold, the gas in the space 104 is discharged to reduce the pressure applied to the template 102.

That is, as shown in FIG. 20B, a possible defect in the pattern can be inhibited by controllably keeping the speed of the template 102 or the change rate of the speed constant. Thus, if the separation speed of the template 102 increases, gas is introduced into the space 104 to keep the speed of the template 102 or the change rate of the speed constant.

According to modification 1 described above, the separation speed of the template 102 is measured. When the template 102 is separated from the resist 101, the separation speed of the template 102 is measured so that the gas is introduced into or discharged from the back surface side of the template 102 through the inlet 105 depending on a change in speed. Application of pressure to the back surface side of the template 102 allows the speed of the template 102 or the change rate of the change to be kept constant. This enables inhibition of a possible defect in the resist 101 caused by a rapid change in load.

(Modification 2)

In Modification 1 of the above-described embodiment, the separation speed of the template 102 is measured using laser beams. The separation speed of the template 102 is measured to allow determination of whether to introduce or discharge the gas into or from the space 104. In Modification 2, a method of measuring the separation speed by observing the separation state of the template 102 with a CCD or the like will be described. The process through the step of filling the resist 101 into the pattern in the template 102 is similar to that in the above-described embodiment and thus will not be described.

When the template 102 is made of glass and the resist 101 is also colorless and transparent, if the resist 101 is filled into the pattern in the template 102, the resist 101 is assimilated with the template 102.

However, when the template 102 is separated, the observed state of the area from which the resist 101 has been separated is different from that of the area from which the resist 101 has not been separated. As described above, the separation of the template generally progresses from the end to the central portion. Thus, the observed separation state of the template 102 appears like a ring-like pattern (annular pattern). The separation speed of the template 102 can be measured by, for example, observing this pattern with a CCD (not shown in the drawings) installed above the template holding section 103 to measure the speed at which the size of the annular pattern decreases.

According to Modification 2 described above, as is the case with Modification 1 described above, the separation speed of the template 102 is measured by observing the released resist 101 from above the template 102 with a CCD or the like. That is, when the template 102 is separated from the resist 101, the separation speed of the template 102 is measured so that the gas is introduced into or discharged from the back surface side of the template 102 through the inlet 105 depending on a change in speed. Application of pressure to the back surface side of the template 102 allows the speed of the template 102 or the change rate of the change to be kept constant. This enables inhibition of a possible defect in the resist 101 caused by a rapid change in load.

(Modification 3)

In the embodiment and Modifications 1 and 2 described above, the load imposed on the template 102 or the separation speed of the template 102 is measured. Then, when the template 102 is separated, the load imposed on the template 102 or the separation speed of the template 102 is measured to allow determination of whether to introduce or discharge the gas into or from the space 104. In Modification 3, a method will be described which allows determination of whether to introduce or discharge the gas into or from the space 104 based on design data on the template 102 including CAD design pattern information on the pattern formed in the template 102. The process through the step of filling the resist 101 into the pattern in the template 102 is similar to that in the above-described embodiment and thus will not be described.

First, the design data on the template 102 is used to simulate the separation between the template 102 and the resist 101. As a result, timings for introducing and discharging gas into or from the space 104 are calculated depending on a density distribution of the pattern. Imprinting is performed based on the calculated timings. For example, it is assumed that a template including an outer area with a high pattern density and an adjacent inner area with a low pattern density is separated from the resist. Then, a high pressure may be applied to the back surface of the template when the area with the low pattern density is separated compared to when the area with the high pattern density is separated. In contrast, it is assumed that a template including an outer area with a low pattern density and an adjacent inner area with a high pattern density is separated from the resist. Then, a low pressure may be applied to the back surface of the template when the area with the high pattern density is separated compared to when the area with the low pattern density is separated.

In Modification 3 described above, the design data on the template 102 is used to perform pre-simulation to calculate the timings for introducing and discharging the gas for the template 102. When the template 102 is separated from the resist 101, the gas is introduced into or discharged from the back surface side of the template 102 through the inlet 105 in accordance with the calculated timings. This enables inhibition of a possible defect in the resist 101, as is the case with the embodiment and modifications 1 and 2 described above.

(Modification 4)

In Modification 3 described above, whether to introduce or discharge the gas into or from the space 104 is determined based on the design data on the template 102. In Modification 4, a method will be described which allows determination of whether to introduce or discharge the gas into or from the space 104, by observing the separation state of the template 102 with a CCD or the like and referencing the design data on the template 102. The process through the step of filling the resist 101 into the pattern in the template 102 is similar to that in the above-described embodiment and thus will not be described.

As described above, when the template 102 is separated from the resist 101, the separated area (or non-separated area) can be determined using a CCD. Thus, the timings for introducing and discharging the gas depending on the density of the pattern can be calculated by observing the separated area (or non-separated area) with a CCD and referencing the design data on the template 102. Imprinting is performed based on the calculated timings.

In Modification 4 described above, the gas is introduced into or discharged from the back surface side of the template 102 based on the separation state of the resist 101 and the design data on the template 102. This enables inhibition of a possible defect in the resist 101, as is the case with the embodiment and modifications 1, 2, and 3 described above.

In the above-described embodiment and modifications, the gas is used to pressurize the back surface of the template 102. However, any method of applying pressure to the back surface to the template 102 enables the effects of above-described embodiment and modifications to be exerted. Specifically, a piezoelectric element may be used or a liquid may be introduced into the space 104, to apply pressure to the back surface of the template 102.

Furthermore, in the above-described embodiment and modifications, pressure control involving a pressurization timing, a pressure reduction timing, and the like is preformed during a single separation operation (one shot). However, it is possible to exert a given pressure during the period of one shot instead of performing the pressure control. Even in this case, a rapid change in load or speed can be suppressed to some degree. Furthermore, during the separation, the template can be inhibited from being rolled back and can be separated from the substrate while remaining parallel to the substrate. This enables a possible defect in the resist 101 to be prevented.

Additionally, in the above-described embodiment and modifications, pressure is exerted on the back surface of the template 102 to control the load imposed on the template 102 or the speed of the template 102. However, a force required to lift the template 102 may further be adjusted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

[1. An imprint pattern forming method comprising:

contacting a template with a pattern in a front surface with an imprint material formed in a substrate to fill the imprint material into the pattern, wherein the template protrudes toward the front surface when applying pressure to a back surface of the template;

curing the imprint material filled in the pattern to form an imprint material pattern;

after forming the imprint material pattern, separating the template from the imprint material pattern while applying pressure to the back surface of the template, wherein while the template is being separated from the imprint material pattern, the substrate does not protrude and only the template protrudes; and determining a timing for applying the pressure to the back surface of the template, by performing a simulation of a separation between the template and the imprint material, with a design data of the template, wherein the applying the pressure to the back surface of the template is based on the timing, and wherein while the template is being separated from the imprint material pattern, the pressure applied to the back surface of the template is changed.]

[2. An imprint pattern forming method comprising:

contacting a template with a pattern in a front surface with an imprint material formed in a substrate to fill the imprint material into the pattern, wherein the template protrudes toward the front surface when applying pressure to a back surface of the template;

curing the imprint material filled in the pattern to form an imprint material pattern;

after forming the imprint material pattern, separating the template from the imprint material pattern while applying pressure to the back surface of the template, wherein while the template is being separated from the imprint material pattern, the substrate does not protrude and only the template protrudes;

while the template is being separated from the imprint material pattern, observing a separated area or a non-separated area; and determining a timing for applying the pressure to the back surface of the template based on a result of the observation and a design data of the template, wherein the applying the pressure to the back surface of the template is based on the timing, and wherein while the template is being separated from the imprint material pattern, the pressure applied to the back surface of the template is changed.]

[3. The method according to claim 1, wherein while the template is being separated from the imprint material pattern, the pressure applied to the back surface of the template is changed depending on a force required to separate the template.]

[4. The method according to claim 3, wherein the pressure applied to the back surface of the template is increased when the force has at most a first value and is reduced when the force has at least a second value.]

[5. The method according to claim 3, wherein the pressure is applied using gas.]

[6. The method according to claim 3, wherein the force is measured by a measuring section connected to the back surface of the template.]

[7. The method according to claim 1, wherein while the template is being separated from the imprint material pattern, the pressure applied to the back surface of the template is changed depending on a separation speed of the template.]

[8. The method according to claim 7, wherein the pressure applied to the back surface of the template is increased when the separation speed has at least a third value and is reduced when the force has at most a fourth value.]

[9. The method according to claim 7, wherein the pressure is applied using gas.]

[10. The method according to claim 7, wherein the separation speed is measured by irradiating the template and the substrate with a laser beam.]

[11. The method according to claim 1, wherein the applying the pressure to the back surface of the template includes applying a higher pressure when an area of low pattern density is separated and applying a lower pressure when an area of higher density is separated.]

[12. The method according to claim 11, wherein the pressure applied to the back surface of the template is increased when the density has at most a first value and is reduced when the density has at least a second value.]

[13. The method according to claim 1, wherein the pressure is applied using gas.]

*14. An imprint pattern forming method comprising:*

*contacting a template with a pattern in a front surface with an imprint material formed in a substrate to fill the imprint material into the pattern;*

*curing the imprint material filled in the pattern;*

*separating the template from an imprint material pattern while applying pressure to a back surface of the template; and*

*determining a timing for applying the pressure to the back surface of the template based on information that reflects a progress of the separation, wherein the applying the pressure to the back surface of the template is based on the timing, and wherein while the template is being separated from the imprint material pattern, the pressure applied to the back surface of the template is changed.*

*15. The method according to claim 14, wherein while the template is being separated from the imprint material pattern, the pressure applied to the back surface of the template is changed depending on a force required to separate the template.*

*16. The method according to claim 15, wherein the pressure applied to the back surface of the template is increased when the force is below or is equal to a first value and is reduced when the force exceeds or equals to a second value.*

*17. The method according to claim 15, wherein the force is measured by a measuring section connected to the back surface of the template.*

*18. The method according to claim 14, wherein while the template is being separated from the imprint material pattern, the pressure applied to the back surface of the template is changed depending on a separation speed of the template.*

*19. The method according to claim 18, wherein the pressure applied to the back surface of the template is increased when the separation speed exceeds or equals to a first value and is reduced when the force is below or equal to a second value.*

*20. The method according to claim 18, wherein the separation speed is measured by irradiating the template and the substrate with a laser beam.*

*21. The method according to claim 14, wherein the applying the pressure to the back surface of the template includes applying a higher pressure when an area of low pattern density is separated and applying a lower pressure when an area of higher density is separated.*

*22. The method according to claim 21, wherein the pressure applied to the back surface of the template is increased when the density has at most a first value and is reduced when the density has at least a second value.*

*23. The method according to claim 14, wherein the information that reflects a progress of the separation includes a measurement of a size of the separated area or a size of the non-separated area.*

*24. The method according to claim 23, wherein the pressure is determined based on a speed of change in the measured sizes of the separated area or the non-separated area.*

*25. The method according to claim 14, wherein the imprint material is assimilated with the template when the imprint material is filled into the pattern.*

*26. The method according to claim 14, wherein the pressure is applied using a piezoelectric element.*

*27. The method according to claim 14, wherein the pressure is applied using liquid.*

*28. The method according to claim 14, wherein the pressure is applied using gas.*

*29. The method according to claim 14, wherein the template protrudes toward the front surface when applying pressure to a back surface of the template.*

*30. The method according to claim 14, wherein while the template is being separated from the imprint material pattern, the substrate does not protrude and only the template protrudes.*

*31. The method according to claim 14, wherein while the template is being separated from the imprint material, the template is partially separated from the imprint material.*

*32. An imprint pattern forming method comprising:*

*contacting a template with a pattern in a front surface with an imprint material formed in a substrate to fill the imprint material into the pattern;*

*curing the imprint material filled in the pattern;*

*separating the template from an imprint material pattern while applying pressure to a back surface of the template; and*

*determining a timing for applying the pressure to the back surface of the template based on a result of an observation of the imprint material in a separated area, wherein the applying the pressure to the back surface of the template is based on the timing, and wherein while the template is being separated from the imprint material pattern, the pressure applied to the back surface of the template is changed.*

*33. The method according to claim 32, wherein the applying the pressure to the back surface of the template includes applying a higher pressure when an area of low pattern density is separated and applying a lower pressure when an area of higher density is separated.*

*34. The method according to claim 33, wherein the pressure applied to the back surface of the template is increased when the density has at most a first value and is reduced when the density has at least a second value.*

*35. The method according to claim 32, wherein the template protrudes toward the front surface when applying pressure to a back surface of the template.*

*36. The method according to claim 32, wherein while the template is being separated from the imprint material pattern, the substrate does not protrude and only the template protrudes.*

*37. The method according to claim 32, wherein the pressure is applied using gas.*

*38. The method according to claim 32, wherein while the template is being separated from the imprint material, the template is partially separated from the imprint material.*

*39. An imprint pattern forming method comprising:*

*contacting a template with a pattern in a front surface with an imprint material formed in a substrate to fill the imprint material into the pattern;*

*curing the imprint material filled in the pattern;*

*separating the template from an imprint material pattern while applying pressure to the back surface of the template; and*

*changing the pressure applied to the back surface of the template based on a timing for applying the pressure to the back surface of the template while the template is being separated from the imprint material pattern, the timing for applying the pressure to the back surface of the template being determined based on a density distribution of the pattern.*

*40. The method according to claim 39, further comprising determining a timing for applying the pressure to the back surface of the template.*

*41. The method according to claim 39, the timing for applying the pressure to the back surface of the template is determined based on a result of an observation of the imprint material.*

*42. The method according to claim 39, wherein the applying the pressure to the back surface of the template includes applying a higher pressure when an area of low pattern density is separated and applying a lower pressure when an area of higher density is separated.*

*43. The method according to claim 42, wherein the pressure applied to the back surface of the template is increased when the density has at most a first value and is reduced when the density has at least a second value.*

*44. The method according to claim 39, wherein the pressure is applied using gas.*

*45. The method according to claim 39, wherein while the template is being separated from the imprint material, the template is partially separated from the imprint material.*

*46. The method according to claim 39, wherein while the template is being separated from the imprint material, the pressure applied to the back surface of the template is changed depending on a force required to separate the template.*

*47. The method according to claim 46, wherein the pressure applied to the back surface of the template is increased when the force is below or is equal to a first value and is reduced when the force exceeds or equals to a second value.*

*48. The method according to claim 46, wherein the force is measured by a measuring section connected to the back surface of the template.*

*49. The method according to claim 39, wherein while the template is being separated from the imprint material pattern, the pressure applied to the back surface of the template is changed depending on a separation speed of the template.*

*50. The method according to claim 39, wherein the pressure applied to the back surface of the template is increased when the separation speed exceeds or equals to a first value and is reduced when the force is below or equal to a second value.*

*51. The method according to claim 49, wherein the separation speed is measured by irradiating the template and the substrate with a laser beam.*

*52. The method according to claim 39, wherein the result of the observation includes a measurement of a size of the separated area or a size of the non-separated area.*

*53. The method according to claim 39, wherein template is bent while the template is being separated.*

* * * * *